United States Patent
Watson et al.

(10) Patent No.: US 12,334,364 B2
(45) Date of Patent: Jun. 17, 2025

(54) SYSTEMS AND METHODS FOR CONTROLLING PRECURSOR DELIVERY

(71) Applicant: ENTEGRIS, INC., Billerica, MA (US)

(72) Inventors: Michael Watson, Leander, TX (US); Christopher Calhoun, Burnet, TX (US); Cristian Ocampo, Cedar Park, TX (US); Scott L. Battle, Cedar Park, TX (US); Benjamin Cardozo, Burnet, TX (US); Benjamin R. Garrett, Leander, TX (US)

(73) Assignee: ENTEGRIS, INC., Billerica, MA (US)

( * ) Notice: Subject to any disclaimer, the term of this patent is extended or adjusted under 35 U.S.C. 154(b) by 44 days.

(21) Appl. No.: 18/123,447

(22) Filed: Mar. 20, 2023

(65) Prior Publication Data

US 2023/0298909 A1    Sep. 21, 2023

Related U.S. Application Data

(60) Provisional application No. 63/322,195, filed on Mar. 21, 2022.

(51) Int. Cl.
| | |
|---|---|
| *H01L 21/67* | (2006.01) |
| *C23C 16/08* | (2006.01) |
| *C23C 16/448* | (2006.01) |
| *C23C 16/455* | (2006.01) |

(52) U.S. Cl.
CPC ........ *H01L 21/67017* (2013.01); *C23C 16/08* (2013.01); *C23C 16/448* (2013.01); *C23C 16/45561* (2013.01)

(58) Field of Classification Search
CPC . H01L 21/67017; C23C 16/08; C23C 16/448; C23C 16/45561; C23C 16/4481; C23C 16/52

See application file for complete search history.

(56) References Cited

U.S. PATENT DOCUMENTS

| | | |
|---|---|---|
| 6,299,692 B1 | 10/2001 | Ku et al. |
| 10,385,452 B2 | 8/2019 | Hendrix et al. |
| 10,392,700 B2 | 8/2019 | Baum et al. |

(Continued)

FOREIGN PATENT DOCUMENTS

| | | |
|---|---|---|
| CN | 108699688 A | 10/2018 |
| KR | 100269560 B1 | 10/2000 |
| WO | 2021067764 A1 | 4/2021 |

OTHER PUBLICATIONS

Chemistry Learner (https://www.chemistrylearner.com/clausius-clapeyron-equation.html) (Year: 2024).*

*Primary Examiner* — Michael G Miller

(57) ABSTRACT

Systems and methods for controlling precursor delivery. The systems and methods may comprise a precursor delivery vessel in fluid communication with a gas flow line. The precursor delivery vessel may comprise at least one tray containing a vaporizable precursor. An amount of thermal energy may be supplied to the at least one tray in an amount sufficient to vaporize the vaporizable precursor. The vaporized precursor may be dispensed from the precursor delivery vessel to the gas flow line. The amount of thermal energy supplied to the at least one tray may be adjusted sufficient to maintain a pressure of the vaporized precursor, in the gas flow line, within a pressure range.

10 Claims, 2 Drawing Sheets

(56) References Cited

U.S. PATENT DOCUMENTS

2006/0115589 A1     6/2006   Vukovic
2019/0032206 A1     1/2019   Hodges et al.
2019/0368039 A1*   12/2019   Arteaga .................. C23C 16/34

* cited by examiner

SYSTEMS AND METHODS FOR CONTROLLING PRECURSOR DELIVERY

PRIORITY

This paper claims priority to U.S. provisional patent application No. 63/322,195, with a filing date of Mar. 21, 2022. The priority document is hereby incorporated by reference.

FIELD

The present disclosure relates to systems and methods for controlling delivery of precursors, such as, for example and without limitation, vapor precursors.

BACKGROUND

Conventional vapor delivery systems cannot meet the performance specifications for semiconductor processing tools and the like.

SUMMARY

Some embodiments relate to a method for controlling precursor delivery. In some embodiments, the method comprises at least one of the following steps: obtaining a precursor delivery vessel containing a vaporizable precursor on at least one tray; supplying an amount of thermal energy to the at least one tray sufficient to vaporize the vaporizable precursor; dispensing the vaporized precursor from the precursor delivery vessel to a gas flow line; and adjusting the amount of thermal energy supplied to the at least one tray sufficient to maintain a pressure of the vaporized precursor, in the gas flow line, within a pressure range. In some embodiments, the at least one tray comprises a material having a thermal conductivity of greater than 15 W m$^{-1}$ K$^{-1}$.

In some embodiments, the vaporizable precursor comprises at least one of a metal oxyhalide, a metal halide, or any combination thereof.

In some embodiments, the vaporizable precursor comprises at least one of $MoO_2Cl_2$, $MoOCl_4$, $WO_2Cl_2$, $WOCl_4$, or any combination thereof.

In some embodiments, the at least one tray comprises at least one of a ceramic material, a polymeric material, a metallic material, or any combination thereof.

In some embodiments, the at least one tray comprises a material having a thermal conductivity of 25 W m$^{-1}$ K$^{-1}$ to 470 W m$^{-1}$ K$^{-1}$.

In some embodiments, the pressure range comprises a pressure in a range of 100 Torr to 750 Torr.

In some embodiments, the pressure range comprises a pressure tolerance in a range of ±1 Torr to ±5 Torr.

In some embodiments, the vaporized precursor is generated at a temperature in a range of 100° C. to 250° C.

In some embodiments, a flow rate of the vaporized precursor in the gas flow line is in a range of 50 sccm to 600 sccm.

In some embodiments, the vaporized precursor, when having a pressure within the pressure range, exhibits a non-linear response to changes in temperature.

Some embodiments relate to a system for controlling precursor delivery. In some embodiments, the system comprises a precursor delivery vessel containing a vaporizable precursor on at least one tray. In some embodiments, the at least one tray comprises a material having a thermal conductivity of greater than 15 W m$^{-1}$ K$^{-1}$. In some embodiments, the system comprises a heater configured to supply an amount of thermal energy to the at least one tray to generate a vaporized precursor from the vaporizable precursor. The system comprises a gas flow line configured to deliver the vaporized precursor from the precursor delivery vessel to a semiconductor processing tool. In some embodiments, the system comprises a control device configured to adjust the amount of thermal energy supplied to the at least one tray sufficient to maintain a pressure of a vaporized precursor, in the gas flow line, within a pressure range.

In some embodiments, the vaporizable precursor comprises at least one of a metal oxyhalide, a metal halide, or any combination thereof.

In some embodiments, the vaporizable precursor comprises at least one of $MoO_2Cl_2$, $MoOCl_4$, $WO_2Cl_2$, $WOCl_4$, or any combination thereof.

In some embodiments, the at least one tray comprises at least one of a ceramic material, a polymeric material, a metallic material, or any combination thereof.

In some embodiments, the at least one tray comprises a material having a thermal conductivity of 25 W m$^{-1}$ K$^{-1}$ to 470 W m$^{-1}$ K$^{-1}$.

In some embodiments, the pressure range comprises a pressure in a range of 100 Torr to 750 Torr.

In some embodiments, the pressure range comprises a pressure tolerance in a range of ±1 Torr to ±5 Torr.

In some embodiments, the vaporized precursor is generated at a temperature in a range of 100° C. to 250° C.

In some embodiments, a flow rate of the vaporized precursor in the gas flow line is in a range of 50 sccm to 600 sccm.

In some embodiments, the vaporized precursor, when having a pressure within the pressure range, exhibits a non-linear response to changes in temperature.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
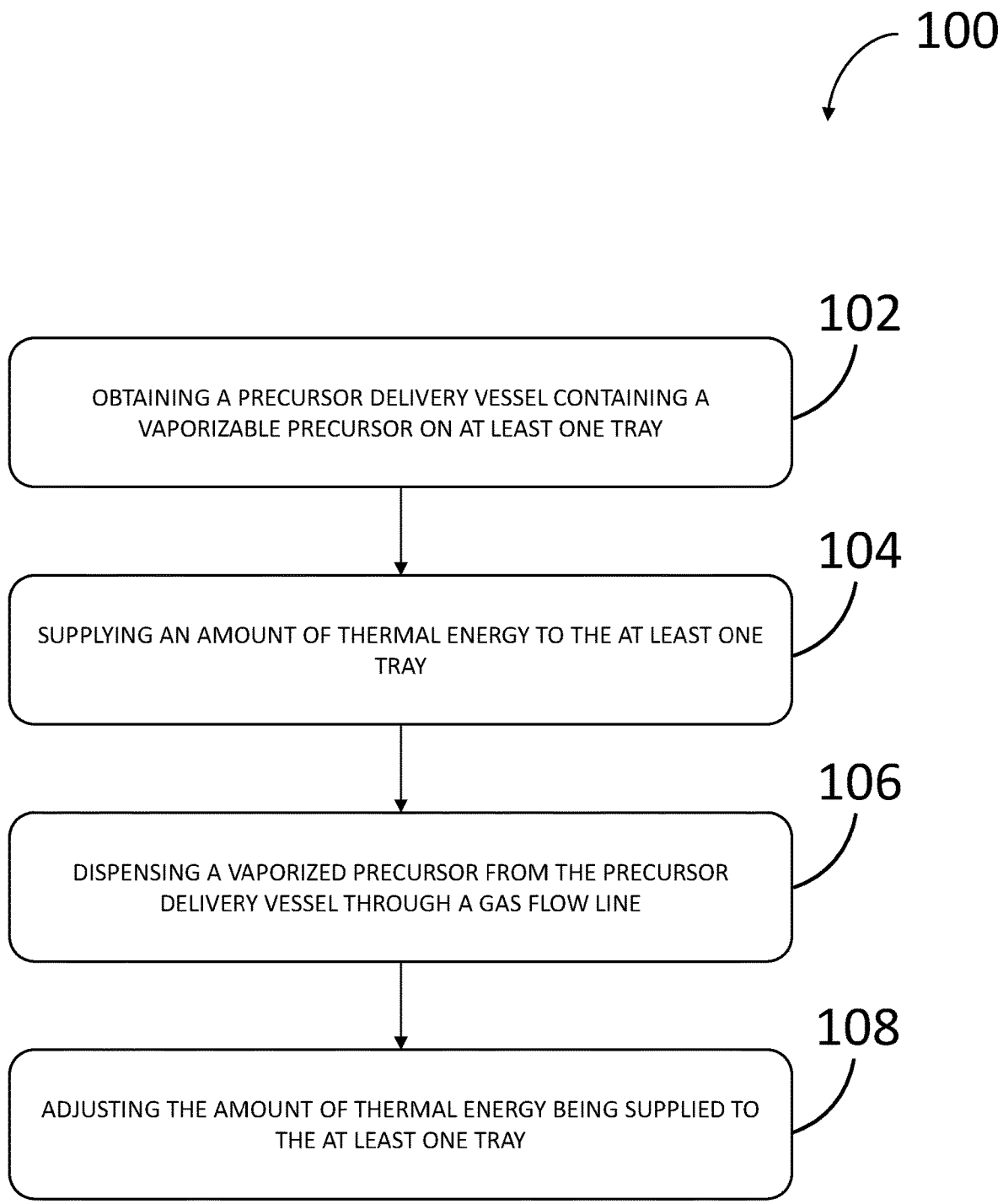
FIG. 1 shows a flowchart of a method for controlling precursor delivery, according to some embodiments.

FIG. 1 shows a flowchart of a method for controlling precursor delivery, according to some embodiments.

As shown in FIG. 1, the method 100 comprises one or more of the following steps: a step 102 of obtaining a precursor delivery vessel containing a vaporizable precursor on at least one tray; a step 104 of supplying an amount of thermal energy to the at least one tray; a step 106 of dispensing a vaporized precursor from the precursor delivery vessel to a gas flow line; and a step 108 of adjusting the amount of thermal energy being supplied to the at least one tray.

At step 102, in some embodiments, a precursor delivery vessel containing a vaporizable precursor on at least one tray is obtained.

The vaporizable precursor may comprise a precursor capable of being vaporized. In some embodiments, the precursor comprises a precursor capable of being vaporized by application of thermal energy (e.g., heat). In some embodiments, the precursor comprises a precursor capable of being vaporized by application of irradiation (e.g., light). In some embodiments, the precursor comprises a precursor capable of being vaporized by application of thermal energy and irradiation. The vaporizable precursor may be present on the at least one tray as a solid, as a liquid, or as a solid and a liquid. For example, in some embodiments, the vaporizable precursor comprises a vaporizable solid precursor. In some embodiments, the vaporizable precursor comprises a vaporizable liquid precursor. In some embodiments, the vaporizable precursor comprises a vaporizable solid precursor and a vaporizable liquid precursor. It will be appreciated that other types of vaporizable precursors may be used herein without departing from the scope of this disclosure.

The vaporizable precursor may comprise, consist of, or consist essentially of at least one of an elemental metal, a metal halide, a metal oxyhalide, an organometallic compound, a metalorganic complex, or any combination thereof.

In some embodiments, the vaporizable precursor comprises, consists of, or consists essentially of at least one of dimethyl hydrazine, trimethyl aluminum (TMA), hafnium chloride ($HfCl_4$), zirconium chloride ($ZrCl_4$), indium trichloride, indium monochloride, aluminum trichloride, titanium iodide, tungsten carbonyl, $Ba(DPM)_2$, bis dipivaloyl methanato strontium ($Sr(DPM)_2$), $TiO(DPM)_2$, tetra dipivaloyl methanato zirconium ($Zr(DPM)_4$), decaborane, octadecaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide ($Zr(t-OBu)_4$), tetrakisdiethylaminozirconium ($Zr(Net_2)_4$), tetrakisdiethylaminohafnium ($Hf(Net_2)_4$), tetrakis (dimethylamino) titanium (TDMAT), tertbutyliminotris (diethylamino) tantalum (TBTDET), pentakis (dimethylamino) tantalum (PDMAT), pentakis (ethylmethylamino) tantalum (PEMAT), tetrakisdimethylaminozirconium ($Zr(NMe_2)_4$), hafniumtertiarybutoxide ($Hf(tOBu)_4$), xenon difluoride ($XeF_2$), xenon tetrafluoride ($XeF_4$), xenon hexafluoride ($XeF_6$), or any combination thereof.

In some embodiments, the vaporizable precursor comprises, consists of, or consists essentially of at least one of decaborane, hafnium tetrachloride, zirconium tetrachloride, indium trichloride, metalorganic β-diketonate complexes, tungsten hexafluoride, cyclopentadienylcycloheptatrienyltitanium (CpTiCht), aluminum trichloride, titanium iodide, cyclooctatetraenecyclo-pentadienyltitanium, biscyclopentadienyltitaniumdiazide, trimethyl gallium, trimethyl indium, aluminum alkyls like trimethylaluminum, triethylaluminum, trimethylamine alane, dimethyl zinc, tetramethyl tin, trimethyl antimony, diethyl cadmium, tungsten carbony, or any combination thereof.

In some embodiments, the vaporizable precursor comprises, consists of, or consists essentially of at least one of elemental boron, copper, phosphorus, decaborane, gallium halides, indium halides, antimony halides, arsenic halides, gallium halides, aluminum iodide, titanium iodide, $MoO_2Cl_2$, $MoOCl_4$, $MoCl_5$, $WCl_5$, $WOCl_4$, $WCl_6$, cyclopentadienylcycloheptatrienyltitanium (CpTiCht), cyclooctatetraenecyclopenta-dienyltitanium, biscyclopentadienyltitanium-diazide, $In(CH_3)_2(hfac)$, dibromomethyl stibine, tungsten carbonyl, metalorganic β-diketonate complexes, metalorganic alkoxide complexes, metalorganic carboxylate complexes, metalorganic aryl complexes, metalorganic amido complexes, or any combination thereof. In some embodiments, the vaporizable precursor comprises, consists of, or consists essentially of at least one of $MoO_2Cl_2$, $MoOCl_4$, $WO_2Cl_2$, $WOCl_4$, or any combination thereof.

In some embodiments, the vaporizable precursor comprises, consists of, or consists essentially of at least one of any type of source material that can be liquefied either by heating or solubilization in a solvent including, for example and without limitation, at least one of decaborane, ($B_{10}H_{14}$), pentaborane ($B_5H_9$), octadecaborane ($B1_8H_{22}$), boric acid ($H_3BO_3$), $SbCl_3$, $SbCl_5$, or any combination thereof. In some embodiments, the vaporizable precursor comprises, consists of, or consists essentially of at least one of $AsCl_3$, $AsBr_3$, $AsF_3$, $AsF_5$, $AsH_3$, $As_4O_6$, $As_2Se_3m$ $As_2S_2$, $As_2S_3$, $As_2S_5$, $As_2Te_3$, $B_4H_{11}$, $B_4H_{10}$, $B_3H_6N_3$, $BBr_3$, $BCl_3$, $BF_3$, $BF_3 \cdot O(C_2H_5)_2$, $BF_3 \cdot HOCH_3$, $B_2H_6$, $F_2$, $HF$, $GeBr_4$, $GeCl_4$, $GeF_4$, $GeH_4$, $H_2$, $HCl$, $H_2Se$, $H_2Te$, $H_2S$, $WF_6$, $SiH_4$, $SiH_2Cl_2$, $SiHCl_3$, $SiCl_4$, $SiH_3Cl$, $NH_3$, $NH_3$, $Ar$, $Br_2$, $HBr$, $BrF_5$, $CO_2$, $CO$, $COCl_2$, $COF_2$, $Cl_2$, $ClF_3$, $CF_4$, $C_2F_6$, $C_3F_8$, $C_4F_8$, $C_5F_8$, $CHF_3$, $CH_2F_2$, $CH_3F$, $CH_4$, $SiH_6$, $He$, $HCN$, $Kr$, $Ne$, $Ni(CO)_4$, $HNO_3$, $NO$, $N_2$, $NO_2$, $NF_3$, $N_2O$, $C_8H_{24}O_4Si_4$, $PH_3$, $POCl_3$, $PCIS$, $PF_3$, $PFS$, $SbH_3$, $SO_2$, $SF_6$, $SF_4$, $Si(OC_2H_5)_4$, $C_4H_{16}Si_4O_4$, $Si(CH_3)_4$, $SiH(CH_3)_3$, $TiCl_4$, $Xe$, $SiF_4$, $WOF_4$, $TaBr_5$, $TaCl_5$, $TaF_5$, $Sb(C_2H_5)_3$, $Sb(CH_3)_3$, $In(CH_3)_3$, $PBr_5$, $PBr_3$, $RuF_5$, or any combination thereof.

In some embodiments, the solvent(s) is an organic solvent, an inorganic solvent, or any combination hereof. In some embodiments, the solvent(s) contains forms of arsenic, phosphorus, antimony, germanium, indium, tin, selenium, tellurium, fluorine, carbon, boron, aluminum, bromine, carbon, chlorine, nitrogen, silicon, tungsten, tantalum, ruthenium, selenium, nickel, sulfur, or any combination thereof. It will be appreciated that other vaporizable precursors may be used herein without departing from this disclosure.

The at least one tray may comprise or may be constructed of a material having a thermal conductivity above a threshold thermal conductivity. For example, in some embodiments, the at least one tray comprises, consists of, or consists essentially of a material having a thermal conductivity of greater than 15 W m$^{-1}$ K$^{-1}$. In some embodiments, the at least one tray comprises, consists of, or consists essentially of a material having a thermal conductivity of at least 16 W m$^{-1}$ K$^{-1}$, at least 17 W m$^{-1}$ K$^{-1}$, at least 18 W m$^{-1}$ K$^{-1}$, at least 19 W m$^{-1}$ K$^{-1}$, at least 20 W m$^{-1}$ K$^{-1}$, at least 25 W m$^{-1}$ K$^{-1}$, at least 50 W m$^{-1}$ K$^{-1}$, at 75 least W m$^{-1}$ K$^{-1}$, at least 100 W m$^{-1}$ K$^{-1}$, at least 150 W m$^{-1}$ K$^{-1}$, at least 200 W m$^{-1}$ K$^{-1}$, at least 250 W m$^{-1}$ K$^{-1}$, at least 300 W m$^{-1}$ K$^{-1}$, at least 350 W m$^{-1}$ K$^{-1}$, at least 400 W m$^{-1}$ K$^{-1}$, at least 450 W m$^{-1}$ K$^{-1}$, at least 500 W m$^{-1}$ K$^{-1}$, at least 550 W m$^{-1}$ K$^{-1}$, or at least 600 W m$^{-1}$ K$^{-1}$. In some embodiments, the at least one tray comprises, consists of, or consists essentially of a material having a thermal conductivity of 16 W m$^{-1}$ K$^{-1}$ to 1000 W m$^{-1}$ K$^{-1}$. For example, in some embodiments, the at least one tray comprises a material having a thermal conductivity of 25 W m$^{-1}$ K$^{-1}$ to 750 W m$^{-1}$ K$^{-1}$, 25 W m$^{-1}$ K$^{-1}$ to 470 W m$^{-1}$ K$^{-1}$, 25 W m$^{-1}$ K$^{-1}$ to 500 W m$^{-1}$ K$^{-1}$, 100 W m$^{-1}$ K$^{-1}$ to 500 W m$^{-1}$ K$^{-1}$, or 150 W m$^{-1}$ K$^{-1}$ to 500 W m$^{-1}$ K$^{-1}$. In some embodiments, the thermal conductivity of the material is the same as the thermal conductivity of the at least one tray, or at least similar to the thermal conductivity of the at least one tray (e.g., within 0.1% to 5% of the thermal conductivity of the at least one tray).

In some embodiments, the at least one tray may further comprise or may further be constructed of a material having a thermal conductivity below the threshold thermal conductivity. For example, in some of these embodiments, the at least one tray may further comprise or may further be constructed of a material having a thermal conductivity below the threshold thermal conductivity, provided that the overall thermal conductivity of the at least one tray is greater than the threshold thermal conductivity (e.g., greater than 15 W m$^{-1}$ K$^{-1}$, or any of the thermal conductivity thresholds and ranges disclosed herein). For example, in some embodiments, the at least one tray comprises a material having a thermal conductivity of greater than greater than 15 W m$^{-1}$ K$^{-1}$ and a material having a thermal conductivity of 15 W m$^{-1}$ K$^{-1}$ or less, wherein an overall thermal conductivity of the at least one tray is greater than greater than 15 W m$^{-1}$ K$^{-1}$ (or any of the thermal conductivity thresholds and ranges disclosed herein). In some embodiments, the proportions or relative amounts of each material may be varied so as to obtain at least one tray having an overall thermal conductivity of greater than 15 W m$^{-1}$ K$^{-1}$ (or any of the thermal conductivity thresholds and ranges disclosed herein).

Non-limiting examples of materials for the at least one tray include, for example and without limitation, at least one of a ceramic material, a polymeric material, a metallic material, or any combination thereof. In some embodiments, the at least one tray does not comprise at least one of the foregoing.

In some embodiments, for example, the at least one tray comprises, consists of, or consists essentially of at least one of silver, copper, aluminum, lead, nickel, gold, iron, zinc, rhodium, lithium, beryllium, sodium, magnesium, potassium, calcium, rubidium, strontium, cesium, barium, radium, scandium, titanium, vanadium, chromium, cobalt, gallium, germanium, arsenic, yttrium, zirconium, niobium, molybdenum, technetium, ruthenium, palladium, cadmium, indium, tin, antimony, hafnium, tantalum, tungsten, rhenium, osmium, iridium, platinum, thallium, neodymium, promethium, holmium, erbium, thulium, thorium, protactinium, uranium, ytterbium, lutetium, an oxide thereof, a mixed oxide thereof, or any combination thereof (e.g., as a mixture thereof, an alloy thereof, etc.). In some embodiments, the at least one tray does not comprise at least one of the foregoing.

In some embodiments, the at least one tray comprises, consists of, or consists essentially of at least one of silicon, boron, carbon, nitrogen, fluorine, oxygen, germanium, arsenic, antimony, chlorine, bromine, iodine, or any combination thereof. In some embodiments, the at least one tray does not comprise at least one of the foregoing.

In some embodiments, the at least one tray comprises, consists of, or consists essentially of at least one of a carbon material. In some embodiments, the carbon material comprises at least one of graphene, graphite, carbon nanoparticles (e.g., carbon nanotubes), or any combination thereof. In some embodiments, the graphene comprises at least one of graphene having 1 to 3 layers (e.g., very few layer graphene (vFLG)), graphene having 2-5 layers (e.g., few layer graphene (FLG)), graphene having 2-10 layers (e.g., multi-layer graphene (MLG)), graphene nanoplatelets (e.g., stacks of graphene sheets (GNP)), graphene oxide, reduced graphene oxide, graphene powder, graphene solution, graphene paste, graphene nanoplatelets (e.g., graphene sheets having a thickness of 1-3 nm and at least one lateral dimension of 100 nm to 100 μm), functionalized graphene, or any combination thereof. In some embodiments, the at least one tray comprises at least one of graphite, crystalline graphite, amorphous graphite, aggregate graphite (e.g., lump graphite or vein graphite), graphite fiber, brass, silicon carbide coated graphite, or any combination thereof. In some embodiments, the at least one tray does not comprise at least one of the foregoing.

In some embodiments, the at least one tray comprises, consists of, or consists essentially of at least one of the following materials: silver, silver alloy, copper, copper alloy, aluminum, aluminum alloy, lead, nickel, nickel clad, stainless steel, graphite, crystalline graphite, amorphous graphite, aggregate graphite (e.g., lump graphite or vein graphite), pyrolytic carbon coated graphite, graphite fiber, very few layer graphene (vFLG), few layer graphene (FLG), multi-layer graphene (MLG)), graphene nanoplatelets (GNP), graphene oxide, reduced graphene oxide, graphene powder, graphene solution, graphene paste, graphene nanoplatelets, functionalized graphene, brass, silicon carbide coated graphite, glass ceramic, aluminum nitride, silicon carbide, alumina, silicon nitride, zirconia, beryllium oxide, boron nitride, zinc oxide, alumina, cupric oxide, carbon nanotubes, brass, diamond, gold, iron, zinc, zinc oxide, alumina, cupric oxide, carbon nanotubes, rhodium, lithium, beryllium, sodium, magnesium, potassium, calcium, rubidium, strontium, cesium, barium, radium, scandium, titanium, vanadium, chromium, cobalt, gallium, germanium, arsenic, yttrium, zirconium, niobium, molybdenum, technetium, ruthenium, palladium, cadmium, indium, tin, antimony, hafnium, tantalum, tungsten, rhenium, osmium, iridium, platinum, thallium, boron, carbon, silicon, nitrogen, fluorine, oxygen, germanium, arsenic, antimony, chlorine, bromine, iodine, neodymium, promethium, holmium, erbium, thulium, thorium, protactinium, uranium, ytterbium, lutetium, a polymer, or any combination thereof (e.g., as a mixture or as an alloy of two or more of any of the preceding materials). In some embodiments, the at least one tray does not comprise at least one of the foregoing.

In some embodiments, the at least one tray or the material of the at least one tray is inert or non-reactive with at least one of the vaporizable precursor, the vaporized precursor, a carrier gas, or any other material with which the at least one tray contacts or is brought into contact.

At step 104, in some embodiments, an amount of thermal energy is supplied to the at least one tray.

Thermal energy may be supplied to the at least one tray in an amount sufficient to vaporize the vaporizable precursor. For different vaporizable precursors, the amount of thermal energy sufficient to vaporize the vaporizable precursor may vary, depending on, for example and without limitation, the vaporizable precursor, the phase in which the vaporizable precursor is present on the at least one tray, the conditions and parameters under which the vaporizing is being conducted (e.g., temperature, pressure, etc.), or any combination thereof. In some embodiments, for example, the amount of thermal energy sufficient to vaporize a vaporizable liquid precursor may depend on the heat of vaporization of the vaporizable liquid precursor. In some embodiments, the amount of thermal energy sufficient to vaporize a vaporizable solid precursor may depend on the heat of sublimination of the vaporizable solid precursor. In some embodiments, the amount of thermal energy required to vaporize a vaporizable precursor, in solid or liquid form, may depend on the specific vaporizable precursor being vaporized.

The thermal energy supplied to the at least one tray may be provided in the form of heat. In some embodiments, for example, supplying thermal energy to the at least one tray comprises heating the at least one tray to a temperature sufficient to vaporize the vaporizable precursor. In some embodiments, supplying thermal energy to the at least one tray comprises heating the at least one tray at a temperature sufficient to vaporize the vaporizable precursor. In some embodiments, supplying thermal energy to the at least one tray comprises heating the vaporizable precursor to a temperature sufficient to vaporize the vaporizable precursor. In some embodiments, supplying thermal energy to the at least one tray comprises heating the vaporizable precursor at a temperature sufficient to vaporize the vaporizable precursor.

The temperature that is sufficient to vaporize the vaporizable precursor may be a temperature in a range of 100° C. to 250° C. In some embodiments, for example, the temperature that is sufficient to vaporize the vaporizable precursor is a temperature in a range of 110° C. to 180° C., 120° C. to 170° C., 120° C. to 150° C., 120° C. to 140° C., 125° C. to 135° C., 130° C. to 190° C., 140° C. to 180° C., 150° C. to 170° C., 155° C. to 165° C., or any other subrange between 100° C. to 250° C. In some embodiments, the vaporized precursor is generated at a temperature in a range of 100° C. to 250° C.

At step 106, in some embodiments, the vaporized precursor is dispensed from the precursor delivery vessel to the gas flow line.

The vaporized precursor may be dispensed from the precursor delivery vessel to the gas flow line. In some embodiments, dispensing the vaporized precursor from the precursor delivery vessel may comprise discharging the vaporized precursor to the gas flow line. In some embodiments, dispensing the vaporized precursor from the precursor delivery vessel may comprise releasing the vaporized precursor to the gas flow line. In some embodiments, dispensing the vaporized precursor from the precursor delivery vessel may comprise flowing the vaporized precursor to the gas flow line. In some embodiments, dispensing the vaporized precursor from the precursor delivery vessel may comprise supplying the vaporized precursor to the gas flow line. In some embodiments, dispensing the vaporized precursor from the precursor delivery vessel may comprise delivering the vaporized precursor to the gas flow line. In some embodiments, dispensing the vaporized precursor from the precursor delivery vessel may comprise feeding the vaporized precursor to the gas flow line.

In some embodiments, the vaporized precursor is dispensed from the precursor delivery vessel with a carrier gas. The carrier gas may comprise a gas which is unreactive or inert. In some embodiments, the carrier gas comprises at least one of helium, neon, argon, krypton, xenon, nitrogen, or any combination thereof.

The gas flow line may be in fluid communication with a tool. The tool may be located downstream from the precursor delivery vessel. The tool may comprise any vapor precursor-utilizing process. In some embodiments, for example, the tool may comprise a semiconductor fabrication process. In some embodiments, the tool comprises at least one of the following processes: ion implantation, epitaxial growth, plasma etching, reactive ion etching, metallization, physical vapor deposition, chemical vapor deposition, plasma deposition, photolithography, cleaning, doping, or any combination thereof, among others. In some embodiments, these tools are part of a manufacturing process of semiconductor devices and products, microelectronic devices and products, photovoltaic devices and products, or flat-panel display devices and products, and the like. Other tools may be used herein without departing from this disclosure.

At step 108, in some embodiments, the amount of thermal energy being supplied to the at least one tray is adjusted.

The thermal energy being supplied to the at least one tray may be adjusted in an amount sufficient to maintain a pressure of the vaporized precursor, in the gas flow line, within a pressure range. In some embodiments, the amount of thermal energy being supplied to the at least one tray is increased (e.g., by heating so as to increase a temperature of the at least one tray, the vaporizable precursor, or any combination thereof). In some embodiments, the amount of thermal energy being supplied to the at least one tray is decreased (e.g., by not heating (or active cooling) so as to decrease a temperature of the at least one tray, the vaporizable precursor, or any combination thereof). In some embodiments, the gas flow line comprises, in addition to the vaporized precursor, a carrier gas. In some of these embodiments, the adjusting of the thermal energy is sufficient to maintain a pressure of the vaporized precursor and the carrier gas, in the gas flow line, within a pressure range.

Changes in the amount of thermal energy supplied to the at least one tray result in a corresponding change in the pressure of the vaporized precursor in the gas flow line. The pressure of the vaporized precursor in the gas flow line may exhibit at least one of a linear response to changes in thermal energy, a non-linear response to changes in thermal energy, or any combination thereof. In some embodiments, for example, the pressure of the vaporized precursor in the gas flow line may exhibit a linear response or a substantially linear response to changes in temperature. In some embodiments, the pressure of the vaporized precursor in the gas flow line may exhibit a non-linear response or a substantially non-linear response to changes in temperature. In some embodiments, the pressure of the vaporized precursor in the gas flow line may exhibit a linear response or a substantially linear response within a first temperature range, and a non-linear response or a substantially non-linear response in a second temperature range.

As used herein, the term "response ratio" of the vaporizable precursor may refer to a ratio of X:Y, where X is a change in thermal energy supplied to the at least one tray (e.g., a change in temperature (° C.)) and Y is a change in pressure of the vaporized precursor in the gas flow line (Torr). For example, a response ratio of 1:5 may refer to a vaporizable precursor that exhibits a 5 Torr increase or decrease in pressure in the gas flow line in response to a 1° C. increase or decrease in temperature. The response ratio of the vaporizable precursor may be in a range of 1:0.1 to 1:500, or any subrange between 1:01 to 1:500. In some embodiments, for example, the response ratio of the vaporizable precursor may be in a range of 1:0.1 to 1:100, 1:1 to 1:100, 1:1 to 1:75, 1:1 to 1:50, 1:1 to 1:25, 1:1 to 1:20, 1:1 to 1:15, 1:1 to 1:10, or 1:1 to 1:5.

The pressure of the vaporized precursor in the gas flow line may be understood to exhibit a linear response or a substantially linear response to changes in temperature, where the vaporized precursor exhibits a constant response ratio across a given temperature range. The pressure of the vaporized precursor in the gas flow line may be understood to exhibit a non-linear response or a substantially non-linear response to changes in temperature, where the vaporized precursor exhibits two or more response ratios across a given temperature range.

The pressure range may comprise a pressure and a pressure tolerance. As used herein, the term "pressure tolerance" refers to the acceptable variation in pressure relative to a set pressure. For example, for a pressure of 500 Torr and a pressure tolerance of ±5 Torr, the pressure range may be defined as 500 Torr±5 Torr. That is, the pressure range may comprise pressures within the range of 495 Torr to 505 Torr.

The pressure range may comprise a pressure in a range of 100 Torr to 750 Torr. For example, in some embodiments, the pressure range may comprise a pressure in a range of 100 Torr to 750 Torr, 100 Torr to 700 Torr, 100 Torr to 650 Torr, 100 Torr to 600 Torr, 100 Torr to 550 Torr, 100 Torr to 500 Torr, 100 Torr to 450 Torr, 100 Torr to 400 Torr, 100 Torr to 350 Torr, 100 Torr to 300 Torr, 100 Torr to 250 Torr, 100 Torr to 200 Torr, 100 Torr to 150 Torr, 150 Torr to 750 Torr, 200 Torr to 750 Torr, 250 Torr to 750 Torr, 300 Torr to 750 Torr, 350 Torr to 750 Torr, 400 Torr to 750 Torr, 450 Torr to 750 Torr, 500 Torr to 750 Torr, 550 Torr to 750 Torr, 600 Torr to 750 Torr, 650 Torr to 750 Torr, 700 Torr to 750 Torr, or any other subrange between 100 Torr to 750 Torr.

The pressure range may comprise a pressure tolerance in a range of ±0.1 Torr to ±50 Torr. In some embodiments, the pressure range comprises a pressure tolerance in a range of ±0.1 Torr to ±40 Torr, ±0.1 Torr to ±30 Torr, ±0.1 Torr to ±20 Torr, ±0.1 Torr to ±10 Torr, ±0.1 Torr to ±5 Torr, ±1 Torr to ±5 Torr, ±1 Torr to ±10 Torr, or ±1 Torr to ±20 Torr. In some embodiments, the pressure range comprises a pressure tolerance of ±0.1 Torr, ±1 Torr, ±2 Torr, ±4 Torr, ±5 Torr, ±8 Torr, ±10 Torr, ±12 Torr, ±14 Torr, ±15 Torr, ±18 Torr, ±20 Torr, ±22 Torr, ±24 Torr, ±25 Torr, ±28 Torr, ±30 Torr, ±32 Torr, ±34 Torr, ±35 Torr, ±38 Torr, ±40 Torr, ±42 Torr, ±44 Torr, ±45 Torr, ±48 Torr, ±50 Torr, or any other pressure tolerance between ±1 Torr to ±50 Torr.

The amount of thermal energy supplied to the at least one tray may be adjusted sufficient to maintain a flow rate of the vaporized precursor, in the gas flow line, within a flow rate range.

The flow rate range may comprise a flow rate and a flow rate tolerance. As used herein, the term "flow rate tolerance" refers to the acceptable variation in flow rate relative to a set flow rate. For example, for a flow rate of 500 sccm and a flow rate tolerance of ±5 sccm, the flow rate range may be defined as 500 sccm±5 sccm. That is, the flow rate range may comprise flow rates within the range of 495 sccm to 505 sccm.

The flow rate of the vaporized precursor may be a flowrate in a range of 50 sccm to 750 sccm. For example, in some embodiments, the flow rate of the vaporized precursor may be a flowrate in a range of 50 sccm to 750 sccm, 50 sccm to 700 sccm, 50 sccm to 650 sccm, 50 sccm to 600 sccm, 50 sccm to 550 sccm, 50 sccm to 500 sccm, 50 sccm to 450 sccm, 50 sccm to 400 sccm, 50 sccm to 350 sccm, 50 sccm to 300 sccm, 50 sccm to 250 sccm, 50 sccm to 200 sccm, 50 sccm to 150 sccm, 50 sccm to 100 sccm, 100 sccm to 750 sccm, 150 sccm to 750 sccm, 200 sccm to 750 sccm, 250 sccm to 750 sccm, 300 sccm to 750 sccm, 350 sccm to 750 sccm, 400 sccm to 750 sccm, 450 sccm to 750 sccm, 500 sccm to 750 sccm, 550 sccm to 750 sccm, 500 sccm to 700 sccm, 550 sccm to 700 sccm, 600 sccm to 700 sccm, 500 sccm to 650 sccm, 500 sccm to 600 sccm, or any other subrange between 50 sccm and 750 sccm.

The flow rate range may comprise a flow rate tolerance in a range of ±0.1 sccm to ±50 sccm. In some embodiments, the flow rate range comprises a flow rate tolerance of ±0.1 sccm, ±1 sccm, ±2 sccm, ±4 sccm, ±5 sccm, ±8 sccm, ±10 sccm, ±12 sccm, ±14 sccm, ±15 sccm, ±18 sccm, ±20 sccm, ±22 sccm, ±24 sccm, ±25 sccm, ±28 sccm, ±30 sccm, ±32 sccm, ±34 sccm, ±35 sccm, ±38 sccm, ±40 sccm, ±42 sccm, ±44 sccm, ±45 sccm, ±48 sccm, ±50 sccm, or any other flow rate tolerance between ±1 sccm to ±50 sccm.

Figure 2:
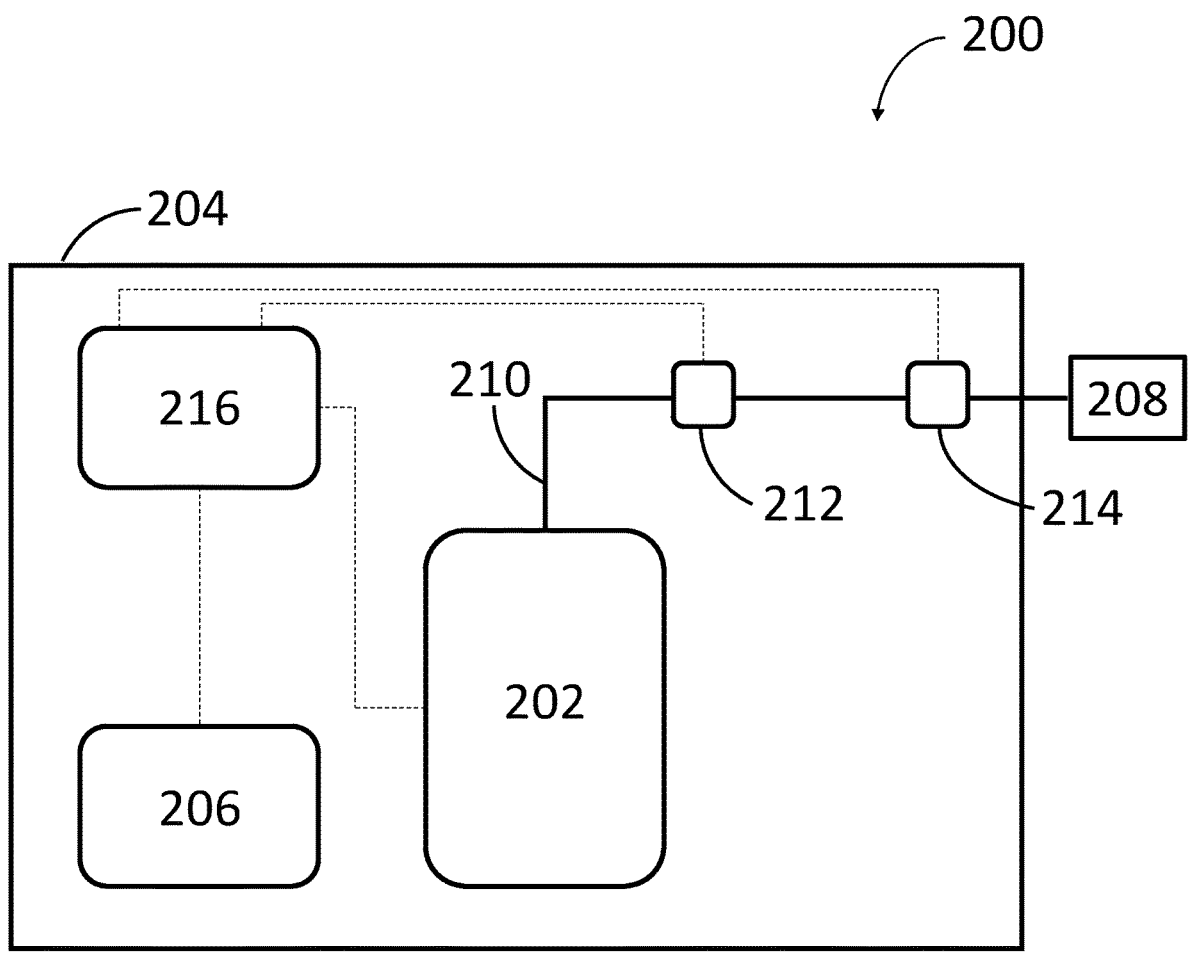
FIG. 2 shows a schematic diagram of a system for controlling precursor delivery, according to some embodiments.

FIG. 2 is a schematic diagram of a system 200 for controlling precursor delivery, according to some embodiments.

As shown in FIG. 2, the system 200 may comprise a precursor delivery vessel 202 disposed in an interior volume of an enclosure 204, which is optional. The precursor delivery vessel 202 may contain a vaporizable precursor on at least one tray. A thermal energy unit 206 may be in thermal communication with the precursor delivery vessel 202 for supplying an amount of thermal energy to the at least one tray sufficient to vaporize the vaporizable precursor. The vaporized precursor may be dispensed from the precursor delivery vessel 202 to a tool 208, such as, for example and without limitation, a semiconductor processing tool, via a gas flow line 210. A sensor 212 and a flow control device 214 may be fluidly disposed in the gas flow line 210, between the precursor delivery vessel 202 and the tool 208. It will be appreciated that other configurations may be employed without departing from the scope of this disclosure.

The precursor delivery vessel 202 may comprise a vaporizable precursor on at least one tray disposed in an interior volume of the precursor delivery vessel 202. In some embodiments, the at least one tray comprises a plurality of trays. In some embodiments, the plurality of trays is stacked in the interior volume of the precursor delivery vessel 202. In some embodiments, the plurality of trays is mounted in the interior volume of the precursor delivery vessel 202 (e.g., secured, fastened, etc. to an interior surface of the precursor delivery vessel 202). In some embodiments, the plurality of trays is suspended in the interior volume of the precursor delivery vessel 202. In some embodiments, the plurality of trays is expandable such that the one or more trays, in an expanded configuration, are wedged (e.g., by applying a pressure or other force) against an interior surface in the interior volume of the precursor delivery vessel 202.

It will be appreciated that the precursor delivery vessel 202 may comprise additional elements, such as, for example and without limitation, at least one of a carrier gas inlet for introducing a carrier gas, an inlet, an outlet, a control valve, a pressure regulator, or any combination thereof, among other things.

The thermal energy unit 206 may be configured to supply an amount of thermal energy (e.g., in the form of heat) to the at least one tray of the precursor delivery vessel 202 sufficient to vaporize the vaporizable material. The thermal energy unit 206 is not particularly limited so long as the at least one tray is brought to a desired temperature level and maintained at such temperature level in an accurate and reliable manner. In some embodiments, the thermal energy unit 206 is a heat jacket wrapped around the precursor delivery vessel 202. In some embodiments, the thermal energy unit 206 is a ribbon heater wound around the precursor delivery vessel 202. In some embodiments, the thermal energy unit 206 is a block heater having a shape covering at least a portion (or a major portion) of an external surface of the precursor delivery vessel 202. In some embodiments, the thermal energy unit 206 is a heat transfer fluid in fluid communication with the precursor delivery vessel 202 (e.g., via a heat exchanger unit).

The gas flow line 210 may fluidly connect the precursor delivery vessel 202 to the tool 208. The gas flow line 210 may comprise a pipe, a conduit, or other structure defining a lumen through which the vaporized precursor (and in some embodiments a carrier gas) may flow. The sensor 212 and the flow control device 214 may be fluidly disposed in the gas flow line 210, between the precursor delivery vessel 202 and the tool 208. The sensor 212 may comprise any device capable of sensing (e.g., measuring) a characteristic of the vaporized precursor in the gas flow line 210. For example, in some embodiments, the characteristic comprises at least one of a pressure of the vaporized precursor (e.g., and in some embodiments a carrier gas), a flow rate of the vaporized precursor (e.g., and in some embodiments a carrier gas), a temperature of the vaporized precursor (e.g., and in some embodiments a carrier gas), or any combination thereof. In some embodiments, the flow control device 214 comprises a mass flow controller, among other flow control devices.

The system 200 may further comprise a control device 216. In some embodiments, the control device may be configured to receive signals for monitoring a characteristic of the vaporized precursor in the gas flow line 210. In some embodiments, the control device may be configured to transmit signals for controlling a characteristic of the vaporized precursor in the gas flow line 210. For example, in some embodiments, the control device 216 receives signals from the sensor 212 on a continuous or intermittent basis over time. In some embodiments, the control device 216 transmits signals to the thermal energy unit 206 in response to the signals received from the sensor 212. In some embodiments, the control device 216 may be configured to monitor and control the pressure, flow rate, or another characteristic of the vaporized precursor in the gas flow line by receiving signals from the sensor 212 and transmitting signals to thermal energy unit 206.

In some embodiments, for example, the control device 216 is configured to maintain a pressure in the gas flow line 210 within a pressure range. If the pressure of the vaporized precursor in the gas flow line 210 is measured to be outside the pressure range, the control device 216 may be configured to adjust the amount of thermal energy supplied to the at least one tray in an amount sufficient to maintain a pressure of the vaporized precursor (and in some embodiments the carrier gas) in the gas flow line 210 within a pressure range. For example, the control device 216 may be configured to increase the amount of thermal energy supplied to the at least one tray in response to the measured pressure being less than the pressure at lower limit of the pressure range. The control device 216 may be configured to decrease the amount of thermal energy supplied (or cease supplying thermal energy) to the at least one tray in response to the measured pressure being greater than the pressure at the upper limit of the pressure range.

In some embodiments, the control device 216 may be configured to monitor and control other parameters, such as, for example and without limitation, a flow rate of the vaporized precursor (and in some embodiments a carrier gas) in the gas flow line. For example, in some embodiments, the control device is configured to maintain a flow rate of the vaporized precursor (and in some embodiments a carrier gas) in the gas flow line within a flow rate range. If the flow rate of the vaporized precursor in the gas flow line 210 is measured to be outside the flow rate range, the control device 216 may be configured to adjust the amount of thermal energy supplied to the at least one tray. For example, the control device 216 may be configured to increase the amount of thermal energy supplied to the at least one tray in response to the measured flow rate being less than the flow rate at the lower limit of the flow rate range. The control device 216 may be configured to decrease the amount of thermal energy supplied to the at least one tray in response to the measured flow rate being greater than the flow rate at the upper limit of the flow rate range.

In some embodiments, the control device 216 is a specialized computer device (e.g., the control device 216 is not a general computer), comprising at least one of a processor, a memory, a program, or any combination thereof. In some embodiments, the program comprises an adaptive or intelligent program configured to adjust the supply of thermal energy without human intervention.

The tool 208 may comprise any vapor precursor-utilizing process. In some embodiments, for example, the tool 208 may comprise a semiconductor fabrication process. In some embodiments, the tool 208 comprises at least one of the following processes: ion implantation, epitaxial growth, plasma etching, reactive ion etching, metallization, physical vapor deposition, chemical vapor deposition, plasma deposition, photolithography, cleaning, doping, or any combination thereof, among others. In some embodiments, these tools are part of a manufacturing process of semiconductor devices and products, microelectronic devices and products, photovoltaic devices and products, or flat-panel display devices and products, and the like. Other tools may be used herein without departing from this disclosure.

The system 200 and the components of the system 200 may be provided in other arrangements and configurations, with additional elements (or fewer elements). The additional elements may comprise additional flow lines and flow circuitry components, such as, for example and without limitation, at least one of flow path selectors; flow control valves; mass flow controllers; pressure regulators; restricted flow orifice elements; thermocouples; monitoring and control devices (e.g., such as, process gas monitoring instrumentation for monitoring the process conditions of the gas precursor being dispensed from the precursor delivery vessel, such as, for example and without limitation, pressure, temperature, flow rate, concentration, and the like); leak detection devices; automated purge equipment and associated actuators for purging the system, the precursor delivery vessel, or any component thereof, when a leak is detected from one or more of the precursor delivery vessels and the system; additional heaters for input of thermal energy to the precursor delivery vessel and their contents; additional heaters for maintaining temperature in the discharge lines and delivery line; or any combination thereof.

ASPECTS

Various Aspects are described below. It is to be understood that any one or more of the features recited in the following Aspect(s) can be combined with any one or more other Aspect(s).

Aspect 1. A method comprising:
obtaining a precursor delivery vessel containing a vaporizable precursor on at least one tray,
wherein the at least one tray comprises a material having a thermal conductivity of greater than 15 W m$^{-1}$ K$^{-1}$;
supplying an amount of thermal energy to the at least one tray sufficient to vaporize the vaporizable precursor;
dispensing the vaporized precursor from the precursor delivery vessel to a gas flow line; and
adjusting the amount of thermal energy supplied to the at least one tray sufficient to maintain a pressure of the vaporized precursor, in the gas flow line, within a pressure range.

Aspect 2. The method according to aspect 1, wherein the vaporizable precursor comprises at least one of a metal oxyhalide, a metal halide, or any combination thereof.

Aspect 3. The method according to any of aspects 1-2, wherein the vaporizable precursor comprises at least one of MoO$_2$Cl$_2$, MoOCl$_4$, WO$_2$Cl$_2$, WOCl$_4$, or any combination thereof.

Aspect 4. The method according to any of aspects 1-3, wherein the at least one tray comprises at least one of a ceramic material, a polymeric material, a metallic material, or any combination thereof.

Aspect 5. The method according to any of aspects 1-4, wherein the at least one tray comprises a material having a thermal conductivity of 25 W m$^{-1}$ K$^{-1}$ to 470 W m$^{-1}$ K$^{-1}$.

Aspect 6. The method according to any of aspects 1-5, wherein the pressure range comprises a pressure in a range of 100 Torr to 750 Torr.

Aspect 7. The method according to any of aspects 1-6, wherein the pressure range comprises a pressure tolerance in a range of ±1 Torr to ±5 Torr.

Aspect 8. The method according to any of aspects 1-7, wherein the vaporized precursor is generated at a temperature in a range of 100° C. to 250° C.

Aspect 9. The method according to any of aspects 1-8, wherein a flow rate of the vaporized precursor in the gas flow line is in a range of 50 sccm to 600 sccm.

Aspect 10. The method according to any of aspects 1-9, wherein the vaporized precursor, when having a pressure within the pressure range, exhibits a non-linear response to changes in temperature.

Aspect 11. A system comprising:
a precursor delivery vessel containing a vaporizable precursor on at least one tray,
wherein the at least one tray comprises a material having a thermal conductivity of greater than 15 W m$^{-1}$ K$^{-1}$;
a heater configured to supply an amount of thermal energy to the at least one tray to generate a vaporized precursor from the vaporizable precursor;
a gas flow line configured to deliver the vaporized precursor from the precursor delivery vessel to a semiconductor processing tool; and
a control device configured to adjust the amount of thermal energy supplied to the at least one tray sufficient to maintain a pressure of a vaporized precursor, in the gas flow line, within a pressure range.

Aspect 12. The system according to aspect 11, wherein the vaporizable precursor comprises at least one of a metal oxyhalide, a metal halide, or any combination thereof.

Aspect 13. The system according to any of aspects 11-12, wherein the vaporizable precursor comprises at least one of MoO$_2$Cl$_2$, MoOCl$_4$, WO$_2$Cl$_2$, WOCl$_4$, or any combination thereof.

Aspect 14. The system according to any of aspects 11-13, wherein the at least one tray comprises at least one of a ceramic material, a polymeric material, a metallic material, or any combination thereof.

Aspect 15. The system according to any of aspects 11-14, wherein the at least one tray comprises a material having a thermal conductivity of 25 W m$^{-1}$ K$^{-1}$ to 470 W m$^{-1}$ K$^{-1}$.

Aspect 16. The system according to any of aspects 11-15, wherein the pressure range comprises a pressure in a range of 100 Torr to 750 Torr.

Aspect 17. The system according to any of aspects 11-16, wherein the pressure range comprises a pressure tolerance in a range of ±1 Torr to ±5 Torr.

Aspect 18. The system according to any of aspects 11-17, wherein the vaporized precursor is generated at a temperature in a range of 100° C. to 250° C.

Aspect 19. The system according to any of aspects 11-18, wherein a flow rate of the vaporized precursor in the gas flow line is in a range of 50 sccm to 600 sccm.

Aspect 20. The system according to any of aspects 11-19, wherein the vaporized precursor, when having a pressure within the pressure range, exhibits a non-linear response to changes in temperature.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

Example 1

A precursor delivery vessel fluidly coupled to a gas flow line was obtained. The gas flow line included a pressure sensor for measuring a pressure of a vaporized precursor flowing through the gas flow line. The gas flow line also included a flow meter for measuring a flow rate of the vaporized precursor flowing through the gas flow line. The trays of the precursor delivery vessel were loaded with MoO$_2$Cl$_2$ as a vaporizable precursor. The trays were heated to a temperature sufficient to vaporize the vaporizable precursor. The pressure of the vaporized precursor was monitored for 30 minutes while the heat supplied to the trays was adjusted. It was discovered that by adjusting the heat supplied to the trays, the flow rate and pressure of the vaporized precursor in the gas flow line was maintained at 600 sccm and above 500 Torr, respectively.

What is claimed is:
1. A method comprising:
obtaining a precursor delivery vessel containing a vaporizable precursor on at least one tray,
wherein the at least one tray comprises a material having a thermal conductivity of greater than 15 W m$^{-1}$ K$^{-1}$;
supplying an amount of thermal energy to the at least one tray sufficient to vaporize the vaporizable precursor;

dispensing the vaporized precursor from the precursor delivery vessel to a gas flow line; and adjusting the amount of thermal energy supplied to the at least one tray sufficient to maintain a pressure of the vaporized precursor, in the gas flow line, within a pressure range.

2. The method of claim 1, wherein the vaporizable precursor comprises at least one of a metal oxyhalide, a metal halide, or any combination thereof.

3. The method of claim 1, wherein the vaporizable precursor comprises at least one of $MoO_2Cl_2$, $MoOCl_4$, $WO_2Cl_2$, $WOCl_4$, or any combination thereof.

4. The method of claim 1, wherein the at least one tray comprises at least one of a ceramic material, a polymeric material, a metallic material, or any combination thereof.

5. The method of claim 1, wherein the at least one tray comprises a material having a thermal conductivity of 25 W $m^{-1}$ $K^{-1}$ to 470 W $m^{-1}$ $K^{-1}$.

6. The method of claim 1, wherein the pressure range comprises a pressure in a range of 100 Torr to 750 Torr.

7. The method of claim 1, wherein the pressure range comprises a pressure tolerance in a range of ±1 Torr to ±5 Torr.

8. The method of claim 1, wherein the vaporized precursor is generated at a temperature in a range of 100° C. to 250° C.

9. The method of claim 1, wherein a flow rate of the vaporized precursor in the gas flow line is in a range of 50 sccm to 600 sccm.

10. The method of claim 1, wherein the vaporized precursor, when having a pressure within the pressure range, exhibits a non-linear response to changes in temperature.

* * * * *